United States Patent
Jung et al.

(10) Patent No.: US 8,094,058 B2
(45) Date of Patent: Jan. 10, 2012

(54) ANALOG DIGITAL CONVERTERS AND IMAGE SENSORS INCLUDING THE SAME

(75) Inventors: Wun-Ki Jung, Suwon-si (KR); Seog Heon Ham, Suwon-si (KR); Dong Hun Lee, Yongin-si (KR); Kwi Sung Yoo, Seoul (KR); Min Ho Kwon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 26 days.

(21) Appl. No.: 12/654,856

(22) Filed: Jan. 6, 2010

(65) Prior Publication Data

US 2010/0171644 A1 Jul. 8, 2010

(30) Foreign Application Priority Data

Jan. 6, 2009 (KR) ........................ 10-2009-0000629

(51) Int. Cl.
*H03M 1/50* (2006.01)
(52) U.S. Cl. .................... 341/166; 341/143; 341/155

(58) Field of Classification Search ................ 341/143, 341/155, 166
See application file for complete search history.

(56) References Cited

U.S. PATENT DOCUMENTS

| | | | | |
|---|---|---|---|---|
| 5,563,535 A * | 10/1996 | Corry et al. | ................... | 327/105 |
| 5,886,659 A * | 3/1999 | Pain et al. | ..................... | 341/155 |
| 6,188,345 B1 * | 2/2001 | McDonald et al. | ........... | 341/143 |
| 6,707,855 B2 * | 3/2004 | Patana | .......................... | 375/244 |
| 7,280,056 B2 | 10/2007 | Puma | | |
| 2007/0115152 A1 * | 5/2007 | Bjorklund et al. | .............. | 341/51 |
| 2008/0074303 A1 | 3/2008 | Rueger et al. | | |

FOREIGN PATENT DOCUMENTS

JP 2008-072362 3/2008

* cited by examiner

*Primary Examiner* — Jean Jeanglaude
(74) *Attorney, Agent, or Firm* — Harness, Dickey & Pierce, P.L.C.

(57) ABSTRACT

The analog-digital converter (ADC) includes a modulator and a digital integrator. The modulator is configured to modulate an input signal and output a modulated signal. The digital integrator includes a plurality of accumulators serially connected to one another. The digital integrator is configured to integrate the modulated signal to output an integration result.

22 Claims, 7 Drawing Sheets

ANALOG DIGITAL CONVERTERS AND IMAGE SENSORS INCLUDING THE SAME

CROSS-REFERENCE TO RELATED APPLICATION(S)

This application claims priority under 35 U.S.C. §119 to Korean Patent Application No. 10-2009-0000629, filed on Jan. 6, 2009, in the Korean Intellectual Property Office (KIPO), the entire contents of which are incorporated herein by reference.

BACKGROUND

1. Field

Example embodiments relate to analog digital converters (ADCs), for example, ADCs capable of performing bi-directional integration and image sensors including the same.

2. Description of the Conventional Art

Conventional image sensors are classified as charge coupled device (CCD) image sensors or complimentary metal-oxide semiconductor (CMOS) image sensors (CISs). Compared to CCDs, conventional CISs are more economical because they use a general CMOS process. Conventional CISs are also more advantageous with regard to integration because conventional CISs can be integrated with an analog/digital signal processing circuit. In addition, conventional CISs may operate with relatively low power and relatively low voltage. As a result, conventional CISs are used more widely in portable apparatuses such as mobile phones, digital cameras, and the like.

A pixel array of a conventional CIS includes a plurality of pixels arranged in a two-dimensional matrix. Each of the pixels outputs an image signal corresponding to optical energy. In more detail, each of the pixels includes a photodiode that integrates photo charges corresponding to the amount of incident light and generates an analog pixel signal on the basis of the integrated photo charges. An ADC converts the analog pixel signal output from each of the pixels into a digital pixel signal, and an image signal processor (ISP) image processes pixel data corresponding to the digital pixel signal.

A conventional sigma-delta ADC, usable during analog-digital conversion, converts an analog pixel signal into a sigma-delta 1-bit digital bitstream through sigma-delta modulation, and obtains multi-bit digital data corresponding to the analog pixel signal from the sigma-delta 1-bit digital bitstream. However, when the conventional sigma-delta ADC performs two analog-digital conversion operations, overhead to post-process results of the two analog-digital conversion operations exists. Conventionally, a method of bitwise inverting a result of one analog-digital conversion operation has been used to reduce the overhead time. However, this method causes relatively high current to flow in the conventional sigma-delta ADC.

SUMMARY

Example embodiments provide analog-digital converters (ADCs) capable of reducing overhead and current consumption. Example embodiments also provide image sensors including ADCs capable of reducing overhead and current consumption.

According to at least one example embodiment, an ADC includes: a modulator and a digital integrator. The modulator is configured to modulate an input signal to output a modulated signal. The digital integrator is configured to integrate the modulated signal to output an integration result. The digital integrator includes: a plurality of accumulators serially connected to one another. At least one of the plurality of accumulators is configured to change a direction in which the integration result is output according to a control signal.

According to at least one other example embodiment, an image sensor includes: an active pixel sensor (APS) array and an ADC block. The ADC block includes a plurality of ADCs. The APS is configured to sense light and generate an image signal based on the sensed light. The plurality of ADCs are configured to convert the image signal into a digital signal by performing correlated double sampling (CDS) on the image signal.

At least one example embodiment provides an image sensing system. The image sensing system includes: an image sensor, a central processing unit (CPU), and a memory. The image sensor is configured to sense light and generate an image signal. The central processing unit (CPU) is configured to control an operation of the image sensor. The memory is configured to store the image signal generated by the image sensor. The image sensor includes: an active pixel sensor (APS) array and an ADC block. The ADC block includes a plurality of ADCs. The APS is configured to sense light and generate an image signal based on the sensed light. The plurality of ADCs are configured to convert the image signal into a digital signal by performing correlated double sampling (CDS) on the image signal.

According to at least some example embodiments, the control signal is input to a first of the plurality of accumulators, and the first accumulator outputs the integration result in a first direction or a second direction according to the control signal. The first accumulator may be a counter.

According to at least some example embodiments, the control signal is input to at least one of the plurality of accumulators other than a first of the plurality of accumulators, which is connected to the modulator, and the at least one accumulator outputs the integration result in a first direction or a second direction according to the control signal.

According to at least some example embodiments, at least one of the plurality of accumulators is configured to add at least one sign bit to a most significant bit of an integration result that is output in a first direction or a second direction according to the control signal, and configured to output a result of the addition. The at least one sign bit has a level according to the control signal. The modulator may be further configured to delta-sigma modulate the input signal and to output the delta-sigma modulated signal.

BRIEF DESCRIPTION OF THE DRAWINGS

Example embodiments will be more clearly understood from the following detailed description taken in conjunction with the accompanying drawings in which.

DETAILED DESCRIPTION

General inventive concepts of example embodiments will now be described more fully with reference to the accompanying drawings, in which example embodiments are shown. Like reference numerals in the drawings denote like elements.

Detailed example embodiments are disclosed herein. However, specific structural and functional details disclosed herein are merely representative for purposes of describing example embodiments. General inventive concepts may, however, may be embodied in many alternate forms and should not be construed as limited to only the example embodiments set forth herein.

It should be understood, however, that there is no intent to limit the general inventive concept to the particular example embodiments disclosed, but on the contrary example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
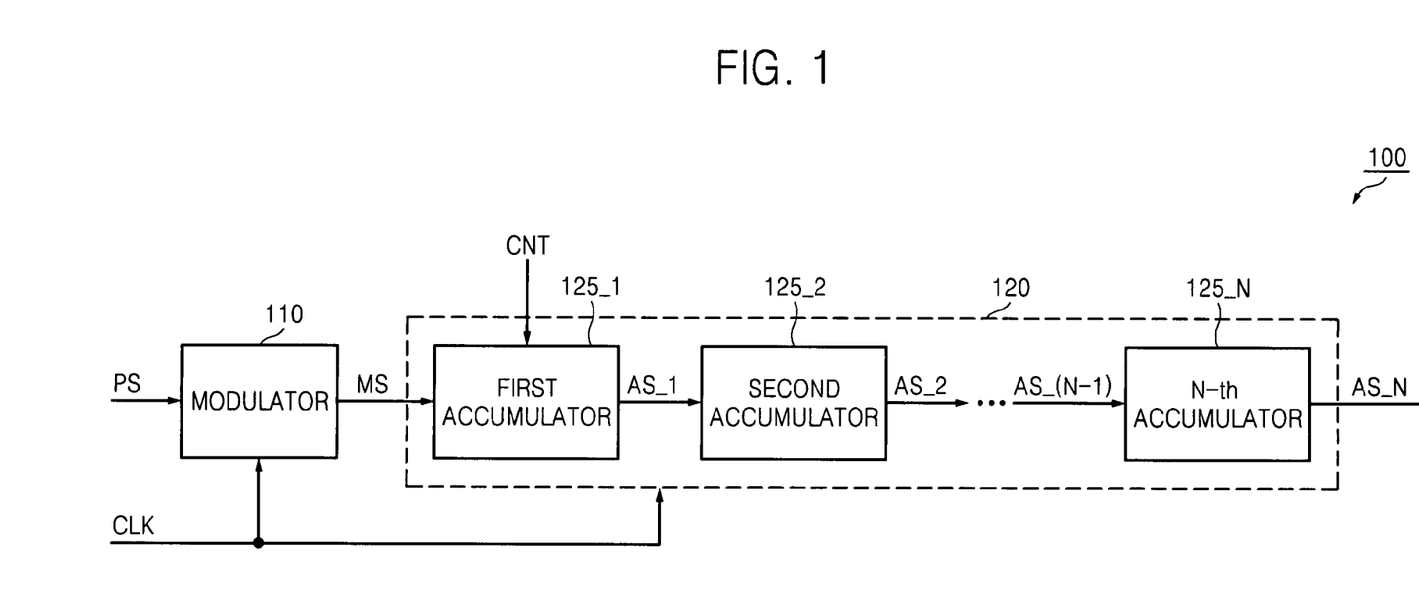
FIG. 1 is a schematic block diagram of an analog-digital converter (ADC) according to an example embodiment.
Figure 2:
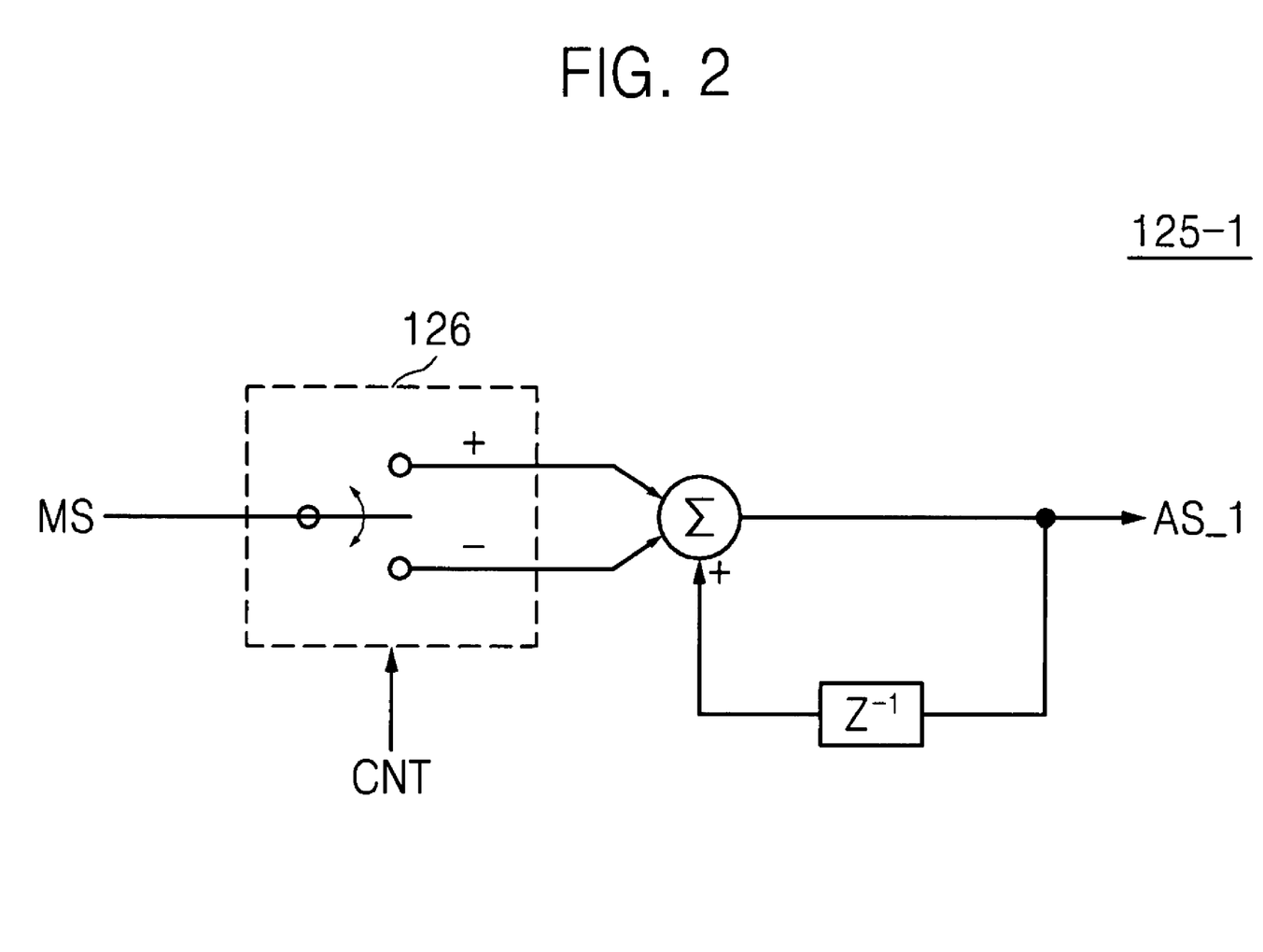
FIG. 2 is a conceptual diagram of a bi-directional accumulator according to an example embodiment.
Figure 3A:
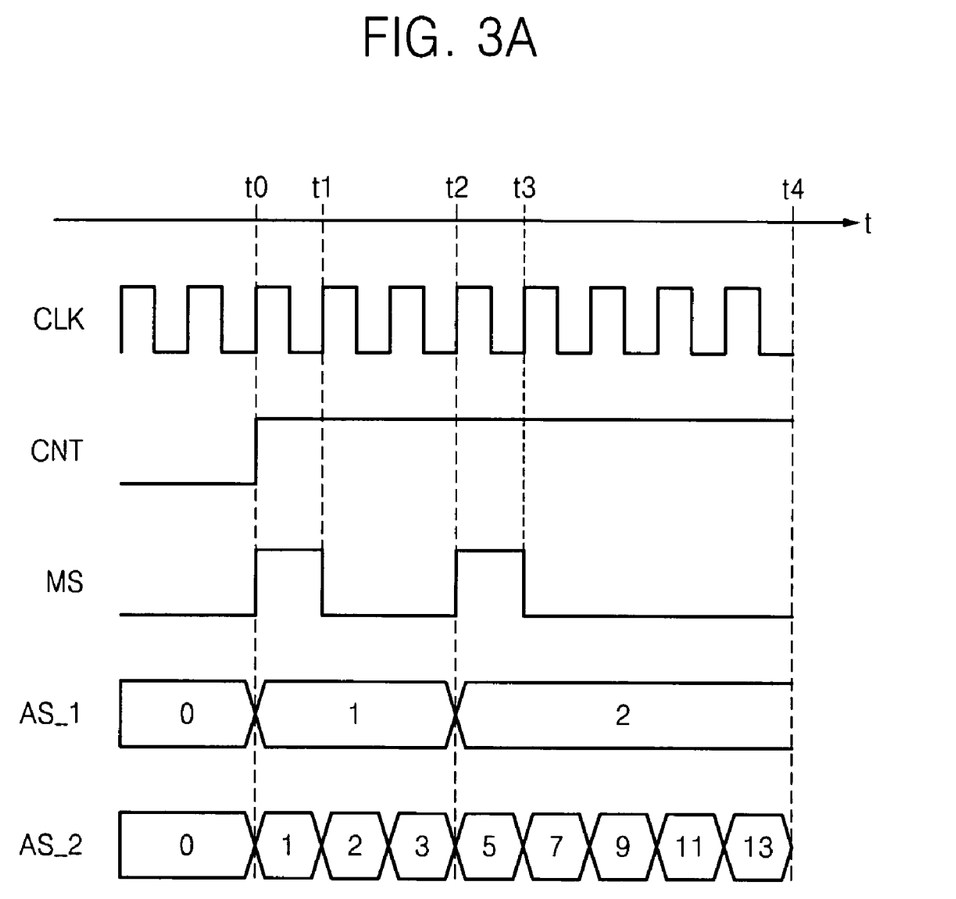
FIGS. 3A and 3B are waveforms according to an example operation of the ADC of FIG. 1.
Figure 3B:
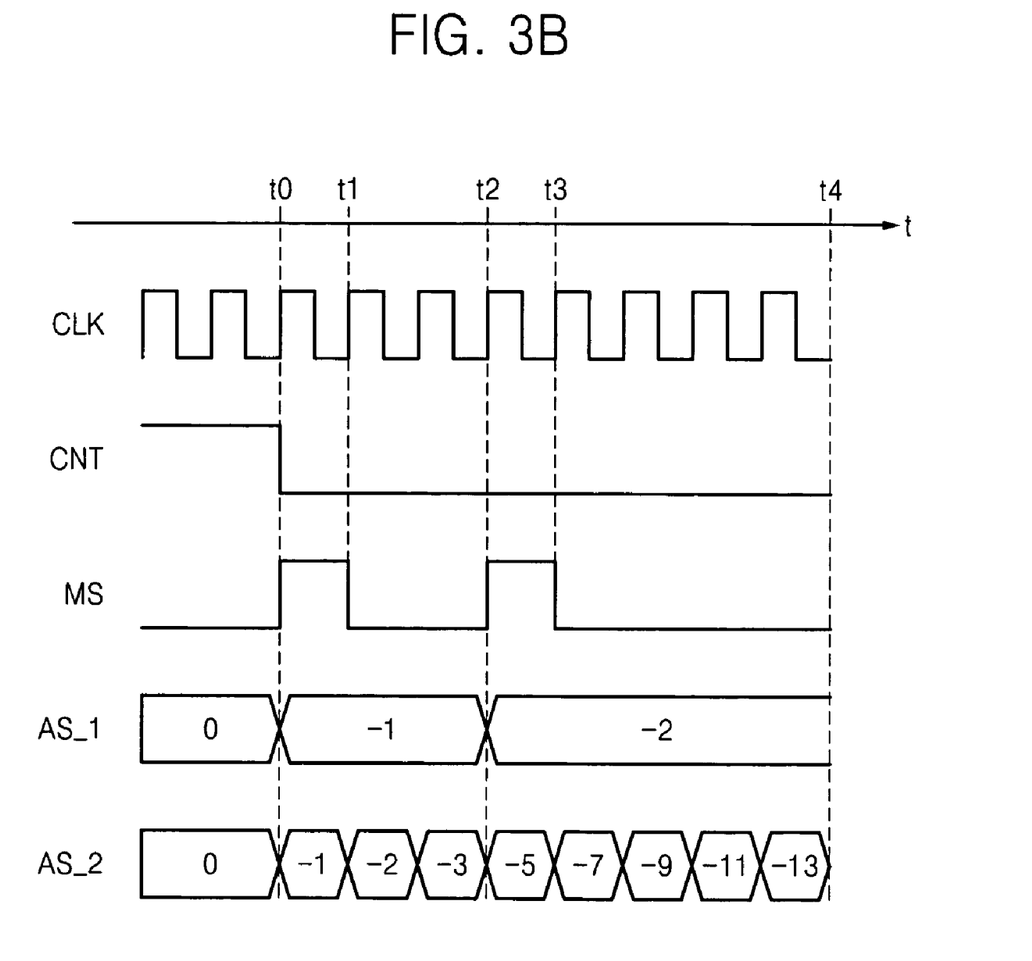

FIG. 1 is a schematic block diagram of an analog-digital converter (ADC) according to an example embodiment. FIG. 2 is a conceptual diagram of a bi-directional accumulator according to an example embodiment. The bi-directional accumulator may be included in the ADC 100. FIGS. 3A and 3B are waveforms for describing an example operation of the ADC 100.

Referring to FIG. 1, an ADC 100 includes a modulator 110 and an a digital integrator (e.g., Nth-order digital integrator) 120. In this example, the ADC 100 is an incremental delta-sigma ADC, and N is a natural number.

In this example embodiment, the modulator 110 is configured to modulate an input pixel signal PS received from an external source to generate a modulated signal MS. The modulator 110 outputs the modulated signal MS. In a more detailed example, the modulator 110 delta-sigma modulates the pixel signal PS received from a pixel array (not shown) of an image sensor (not shown) according to a clock signal CLK received from an external source. The modulator 110 outputs the modulated signal MS corresponding to the result of the delta-sigma modulation. Although described as a pixel signal, the input signal PS received from the external source may include any kind of alternating current (AC) or direct current (DC) signal.

According to example embodiments, the pixel signal PS may be an analog signal including a reset signal and an image signal output from a pixel array of the image sensor. The modulator 110 may delta-sigma modulate each of the reset signal and the image signal to generate and output M-bit (where M is a real number) modulated signals MS corresponding to results of the delta-sigma modulations. More specifically, for example, the modulator 110 may delta-sigma modulate the reset signal to output an M-bit modulated reset signal, and may delta-sigma modulate the image signal to output an M-bit modulated image signal.

Still referring to FIG. 1, the modulated signal MS output from the modulator 110 (e.g., the M-bit modulated reset signal or the M-bit modulated image signal) may be a 1-bit digital stream. The $N^{th}$-order digital integrator 120 is configured to integrate the modulated signal MS from the modulator 110 and output an integration result AS_N. In a more specific example, the $N^{th}$-order digital integrator 120 performs an integration operation on each of two modulated signals output from the modulator 110 (e.g., the modulated reset signal and the modulation image signal) and outputs integration results for each of the modulated signals.

The $N^{th}$-order digital integrator 120 changes the direction in which (or sign of) the integration result is output according to a control signal CNT received from an external source. For example, when an image modulated signal MS is output from the modulator 110, the $N^{th}$-order digital integrator 120 integrates the modulated image signal MS in a first direction (e.g., a positive (+) direction) according to the control signal CNT, and outputs an integration result AS_N. When a modulated reset signal MS is output from the modulator 110, the $N^{th}$-order digital integrator 120 integrates the modulated reset signal MS in a second direction (e.g., a negative (−) direction) according to the control signal CNT, and outputs an integration result AS_N.

As shown in FIG. 1, the $N^{th}$-order digital integrator 120 includes a plurality of accumulators 125_1, 125_2, through to 125_N. The plurality of accumulators 125_1, 125_2, through to 125_N are cascaded to (connected serially with) one another. In this example, N is a natural number.

The first accumulator 125_1 is configured to receive the modulated signal MS from the modulator 110, integrate the modulated signal MS and output a first integration result AS_1 to the second accumulator 125_2. The second through N-th accumulators 125_2 through 125_N receive output signals (e.g., integration results output) from their respective preceding accumulators, integrate the received signals, and output respective integration results.

In more detail with respect to FIG. 1, the second accumulator 125_2 is configured to receive the first integration result AS_1 from the first accumulator 125_1, integrate the first integration result AS_1, and output a second integration result AS_2. The N-th accumulator 125_N is configured to receive an $(N-1)^{th}$ integration result AS_(N−1) from a $(N-1)^{th}$ accumulator (not shown), integrate the $(N-1)^{th}$ integration result AS_(N−1), and output an N-th integration result AS_N. The N-th integration result AS_N is the output signal of the $N^{th}$-order digital integrator 120.

At least one of the first through N-th accumulators 125_1 through 125_N of the $N^{th}$-order digital integrator 120 may be a bi-directional accumulator configured to change the output direction of an integration result according to the control signal CNT. For example, according to the control signal CNT, the first accumulator 125_1 of the $N^{th}$-order digital integrator 120 may integrate the modulated signal MS received from the modulator 110 in the first direction (e.g., the positive direction) to output a first integration result AS_1, or may integrate the modulated signal MS in the second direction (e.g., the negative direction) to output the first integration result AS_1.

FIG. 2 illustrates an accumulator according to an example embodiment. The accumulator shown in FIG. 2 may serve as at least one of the first through N-th accumulators 125_1 through 125_N shown in FIG. 1. The example embodiment shown in FIG. 2 will be described with regard to the first accumulator 125_1 shown in FIG. 1.

Referring to FIG. 2, the first accumulator 125_1 includes a switching unit 126 configured to switch on and off according to the control signal CNT. The switching unit 126 is switched on in the positive direction (+) or the negative direction (−) according to the control signal CNT. Accordingly, the modulated signal MS received from the modulator 110 is integrated in the positive direction or the negative direction according to the control signal CNT. The first accumulator 125_1 outputs the first integration result AS_1 in the positive direction or the negative direction according to a switching operation of the switching unit 126.

Referring to FIGS. 1, 2, and 3A, the modulator 110 and the $N^{th}$-order digital integrator 120 receive the clock signal CLK from an external source. The clock signal CLK has a given, desired or predetermined cycle. During a first time period from t0 to t1 on time axis t, the modulator 110 delta-sigma modulates the pixel signal PS, and outputs a first modulated signal MS. As discussed above, the pixel signal PS may be an image signal from among the reset signal and the image signal. The $N^{th}$-order digital integrator 120 may include the first through N-th accumulators 125_1 through 125_N, and the first accumulator 125_1 may be a bi-directional accumulator. The control signal CNT transitions to a first level (e.g., a high level) at t0 and is input to the first accumulator 125_1.

The first accumulator 125_1 performs a primary integration operation on the first modulated signal MS and outputs a first integration result AS_1 in the first direction (e.g., the positive direction) during a second time period between t0 and t2 on the time axis t according to the control signal CNT at the first level. The second accumulator 125_2 receives the first integration result AS_1 output in the first direction, performs a secondary integration operation on the first integration result AS_1 and outputs a second integration result AS_2 during the second time period between t0 and t2 on the time axis t. The first integration result AS_1 and the second integration result AS_2 may be data signals having given, desired or predetermined numbers of bits. During a third time period between t2 and t3 on the time axis t, the modulator 110 delta-sigma modulates the pixel signal PS and outputs a second modulated signal MS.

The first accumulator 125_1 performs a primary integration operation on the second modulated signal MS and outputs a first integration result AS_1 in the first direction during a fourth time period between t2 and t4 on the time axis t according to the control signal CNT at the first level. The first integration result AS_1 output during the fourth time period between t2 and t4 may be a signal obtained by accumulating from the first integration result AS_1 output during the second time period between t0 and t2. The first integration result AS_1 output during the fourth time period between t2 and t4 may increase in the first direction according to the control signal CNT at the first level.

The second accumulator 125_2 receives the first integration result AS_1 output from the first accumulator 125_1 during the fourth time period between t2 and t4, performs a secondary integration operation on the first integration result AS_1, and outputs a second integration result AS_2. The second integration result AS_2 output during the fourth time period may be a signal obtained by accumulating from the second integration result AS_2 output during the second time period between t0 and t2.

Referring to FIGS. 1, 2, and 3B, during a first time period between t0 and t1 on a time axis t, the modulator 110 delta-sigma modulates the pixel signal PS received from an external source and outputs a first modulated signal MS. The pixel signal may be, for example, the reset signal from among the reset signal and the image signal.

The $N^{th}$-order digital integrator 120 includes the first, second, through to N-th accumulators 125_1, 125_2, through to 125_N. The first accumulator 125_1 may be a bi-directional accumulator. The control signal CNT may transition to a second level (e.g., a low level) at t0 on the time axis t, and be input to the first accumulator 125_1.

The first accumulator 125_1 performs a primary integration operation on the first modulated signal MS and outputs a first integration result AS_1 in the second direction (e.g., in the negative direction) during a second time period between t0 and t2 on the time axis t according to the control signal CNT in the second level. The second accumulator 125_2 receives the first integration result AS_1 output in the first direction, performs a secondary integration operation on the first integration result AS_1, and outputs a second integration result AS_2 during the second time period between t0 and t2 on the time axis t. The first integration result AS_1 and the second integration result AS_2 may be data signals having given, desired or predetermined numbers of bits.

During a third time period between t2 and t3 on the time axis t, the modulator 110 delta-sigma modulates the pixel signal PS and outputs a second modulated signal MS.

The first accumulator 125_1 performs a primary integration operation on the second modulated signal MS and outputs a first integration result AS_1 in the second direction during a fourth time period between t2 and t4 on the time axis t according to the control signal CNT at the second level. The first integration result AS_1 output during the fourth time period between t2 and t4 on the time axis t may be a signal obtained by accumulation from the first integration result AS_1 output during the second time period between t0 and t2 on the time axis t. The first integration result AS_1 output during the fourth time period between t2 and t4 on the time axis t may be increase in the second direction according to the control signal CNT in the second level.

The second accumulator 125_2 receives the first integration result AS_1 output from the first accumulator 125_1 during the fourth time period between t2 and t4 on the time axis t, performs a secondary integration operation on the first integration result AS_1, and outputs a second integration result AS_2. The second integration result AS_2 output during the fourth time period between t2 and t4 on the time axis t may be a signal obtained by accumulation from the second integration result AS_2 output during the second time period between t0 and t2 on the time axis t.

In the example embodiments illustrated in FIGS. 1 through 3B, at least one of the first through N-th accumulators 125_1 through 125_N (e.g., the first accumulator 125_1 of the $N^{th}$-order digital integrator 120) is implemented as a bi-directional accumulator configured to output an integration result in the first direction or the second direction according to the control signal CNT. According to at least one example embodiment, the $N^{th}$-order digital integrator 120 may be entirely implemented bi-directionally. Accordingly, when the ADC 100 performs two analog-digital conversion operations according to pixel signals PS received from the pixel array (e.g., the reset signal and the image signal), the two output signals AS_N of the ADC 100 may have opposite levels so that the two output signals ASN are naturally subtracted. Therefore, the ADC 100 according to at least some example embodiments may not include an additional unit such as a subtractor in contrast with a conventional ADC. Also, the number of arithmetic operations performed by ADCs according to example embodiments may be reduced relative to conventional ADCs. The ADC 100 according to example embodiments may implement correlated double sampling (CDS) of an image sensor without an additional unit.

In the example embodiments shown in FIGS. 1 through 3B, the first accumulator 125_1 of the Nth-order digital integrator 120 may be implemented as an up/down counter configured to perform an up/down counting operation according to the control signal CNT. Thus, the ADC 100 may be constructed relatively simply.

Figure 4:
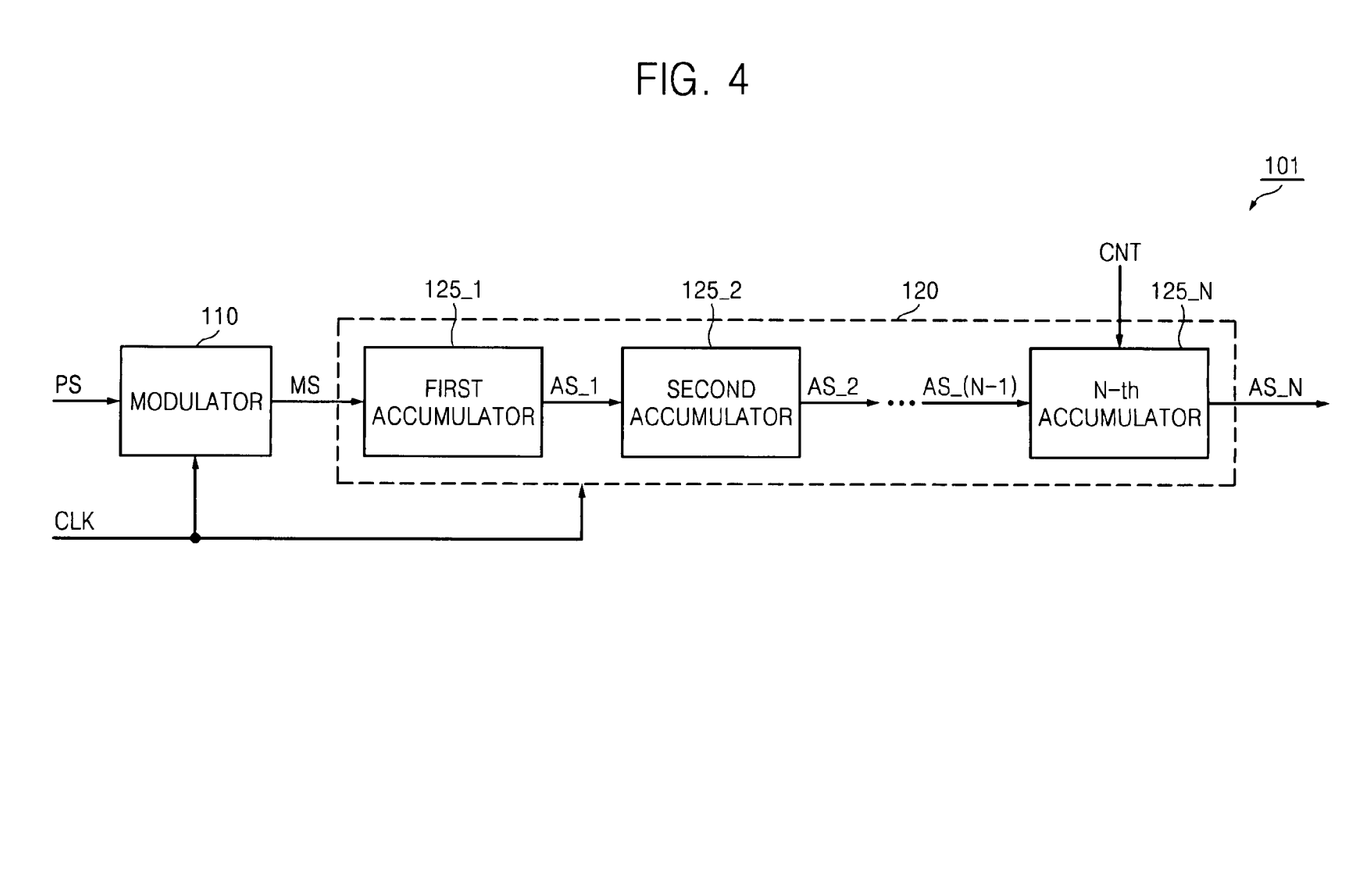
FIG. 4 is a schematic block diagram of an ADC according to another example embodiment.

FIG. 4 is a schematic block diagram of an ADC according to another example embodiment. In the ADC 101 shown in FIG. 4, the N-th accumulator 125_N is a bi-directional accumulator. The N-th accumulator 125_N is the last accumulator in the chain of serially connected accumulators in the $N^{th}$-order digital integrator 120. Although not shown in FIG. 4, an accumulator from among the accumulators 125_1 through 125_N positioned in the middle may also: (or alternatively) be implemented as a bi-directional accumulator. According to at least some example embodiments, any one of the accumulators 125_1 through 125_N of the $N^{th}$-order digital integrator 120 may be implemented as a bi-directional accumulator so that the entire $N^{th}$-order digital integrator 120 may operate bi-directionally.

The $N^{th}$-order digital integrator 120 illustrated in FIGS. 1 through 4 may output an integration result including a sign bit. Referring to FIG. 1, for example, the first accumulator 125_1 of the $N^{th}$-order digital integrator 120 outputs the first integration result AS_1 in the first direction or the second direction according to the control signal CNT. The first integration result AS_1 includes at least one sign bit.

The at least one sign bit may be added to the most significant bit (MSB) of the first integration result AS_1. For example, referring to FIGS. 1 and 3A, when the control signal CNT at a first level is input to the first accumulator 125_1, the first accumulator 125_1 outputs the first integration result AS_1 in the first direction (e.g., the positive direction).

For example, if the first accumulator 125_1 outputs 2 bits '01' as the integration result, the first accumulator 125_1 adds a first sign bit '0' to the MSB of the 2-bit integration result of '01', and 3 bits '001' are output as the first integration result AS_1. In this example, the second accumulator 125_2 receives the first integration result AS_1 of '001', integrates the two bits '01', but not the first sign bit '0', and outputs the second integration result AS_2, which increases in the positive direction.

Referring to FIGS. 1 and 3B, when the control signal CNT at a second level is input to the first accumulator 125_1, the first accumulator 125_1 outputs the first integration result AS_1 in the second direction (e.g., the negative direction). For example, if the first accumulator 125_1 outputs 2 bits '01' as the integration result, the first accumulator 125_1 adds a second sign bit '1' to the MSB of the 2-bit integration result of '01', and outputs 3 bits '101' as the first integration result AS_1. The second accumulator 125_2 receives the first integration result AS_1 of '101', and integrates the two bits '01', but not the second sign bit '1'. The second accumulator 125_2 outputs the second integration result AS_2, which increases in the negative direction.

Figure 5:
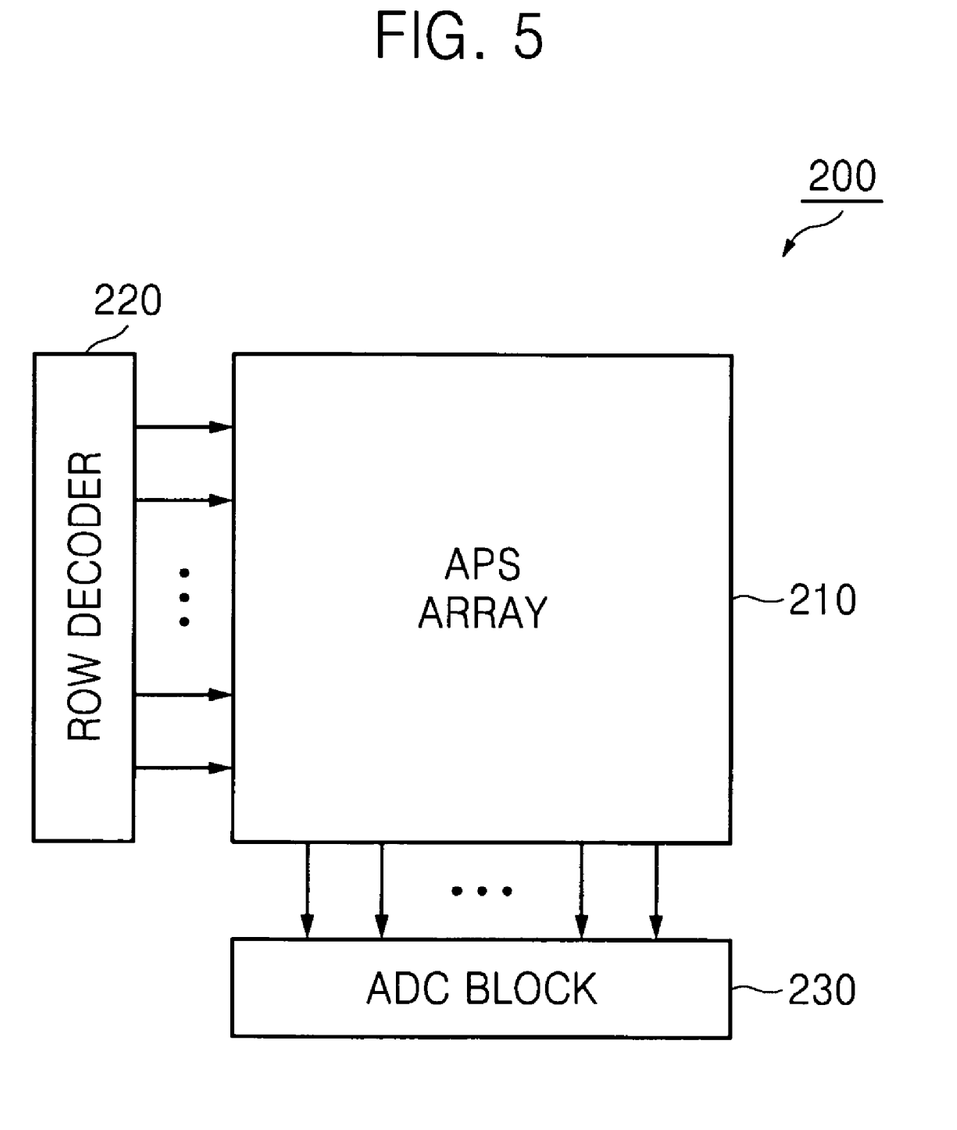
FIG. 5 is a schematic block diagram of an image sensor according to an example embodiment.

FIG. 5 is a schematic block diagram of an image sensor according to an example embodiment.

Referring to FIG. 5, the image sensor 200 includes an active pixel sensor (APS) array 210, a row decoder 220, and an analog-to-digital converter (ADC) block 230.

The APS array 210 includes a plurality of pixels (not shown) arranged in a two-dimensional matrix. The plurality of pixels are connected to a plurality of row lines (not shown), respectively. The plurality of pixels are also connected to a plurality of column lines (not shown), respectively The ADC block 230 includes a plurality of ADCs 100 (see, e.g., FIG. 1) or 101 (see, e.g., FIG. 4). Each of the ADCs 100 or 101 are configured to convert pixel signals, (e.g., a reset signal and an image signal) output from pixels of the APS array 210 into digital signals. Each of the ADCs 100 or 101 are also configured to perform digital CDS.

Figure 6:
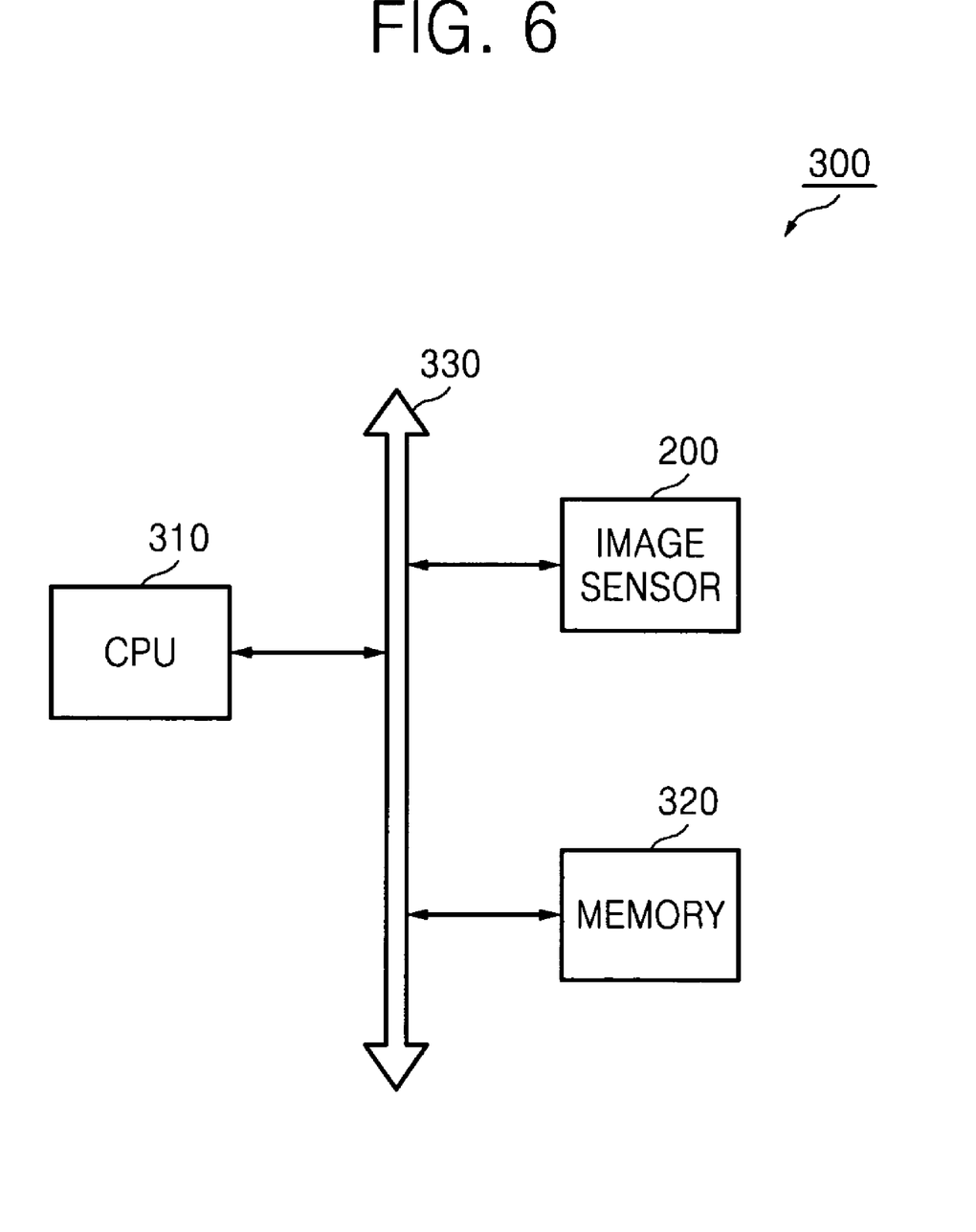
FIG. 6 is a schematic block diagram of an image sensing system according to an example embodiment.

FIG. 6 is a schematic block diagram of an image sensing system according to an example embodiment. The image sensing system of FIG. 6 includes the image sensor 200 of FIG. 5. The image sensing system 300 shown in FIG. 6 may be a computer system, a camera system, a scanner, a mechanized clock system, a navigation system, a video phone, a management system, an auto focusing system, an operation-monitoring system, an image stabilization system, or the like. However, the image sensing system 300 may constitute various other systems.

Referring to FIG. 6, the image sensing system 300 includes a bus 330 connecting a central processing unit (CPU) 310, the image sensor 200, and a memory 320 with one another. Although not shown in FIG. 6, the image sensing system 300 may further include an interface (not shown) connected to the bus 330. The interface enables communication with outside or external hardware and/or software. The interface may be an input/output (I/O) interface, a wireless interface or the like.

The CPU 310 is configured to generate a control signal for controlling an operation of the image sensor 200. The CPU 310 is also configured to provide the control signal to the image sensor 200 via the bus 330. As described above with reference to FIG. 5, the image sensor 200 includes the APS array 210, the row decoder 220, and the ADC block 230. The image sensor 200 is configured to sense light according to the control signal provided from the CPU 310, and configured to generate an image signal by converting the light into an electrical signal.

The memory 320 is configured to receive and store the image signal received from the image sensor 200 via the bus 330. The image sensor 200 may be integrated with the CPU 310 and the memory 320. In some cases, the image sensor 200 may be integrated with a digital signal processor (DSP). Alternatively, the image sensor 200 may be integrated into a separate chip.

In an ADC and an image sensor including the ADC according to at least some example embodiments, at least one accumulator having bi-directivity or bi-directionality is included. Thus, although the image sensor performs two analog-digital conversion operations, overhead to post-process results of the two analog-digital conversion operations may be suppressed and/or avoided, and current consumption of the ADC may be reduced.

While some inventive concepts have been particularly shown and described with reference to example embodiments thereof, it will be understood that various changes in form and details may be made therein without departing from the spirit and scope of the following claims.

What is claimed is:

1. An analog-digital converter (ADC) comprising:
   a modulator configured to modulate an input signal and output a modulated signal; and
   a digital integrator including a plurality of accumulators serially connected to one another, the digital integrator being configured to generate an integration result by integrating the modulated signal; wherein
   at least one of the plurality of accumulators is configured to change a direction in which the integration result is output according to a control signal.

2. The ADC of claim 1, wherein the control signal is input to a first of the plurality of accumulators, and the first accumulator outputs the integration result in a first direction or a second direction according to the control signal.

3. The ADC of claim 2, wherein the first accumulator is a counter.

4. The ADC of claim 1, wherein the control signal is input to the at least one of the plurality of accumulators other than a first of the plurality of accumulators connected to the modulator, and the at least one accumulator outputs the integration result in a first direction or a second direction according to the control signal.

5. The ADC of claim 1, wherein the at least one of the plurality of accumulators is configured to add at least one sign bit to a most significant bit of the integration result that is output in a first direction or a second direction according to the control signal, and configured to output a result of the addition.

6. The ADC of claim 5, wherein the at least one sign bit has a level according to the control signal.

7. The ADC of claim 1, wherein the modulator is configured to delta-sigma modulate the input signal and to output the delta-sigma modulated signal.

8. An image sensor comprising:
   an active pixel sensor (APS) array configured to sense light and generate an image signal based on the sensed light; and
   an analog-digital converter (ADC) block including a plurality of ADCs configured to convert the image signal into a digital signal by performing correlated double sampling (CDS) on the image signal; wherein
   at least one of the plurality of ADCs is the ADC of claim 1.

9. The image sensor of claim 8, wherein the control signal is input to a first of the plurality of accumulators, and the first of the plurality of accumulators outputs the integration result in a first direction or a second direction according to the control signal.

10. The image sensor of claim 9, wherein the first accumulator is a counter.

11. The image sensor of claim 8, wherein the control signal is input to the at least one of the plurality of accumulators other than a first of the plurality of accumulators connected to the modulator, and the at least one accumulator outputs the integration result in a first direction or a second direction according to the control signal.

12. The image sensor of claim 8, wherein the at least one of the plurality of accumulators is configured to add at least one sign bit to a most significant bit of the integration result that is output in a first direction or a second direction according to the control signal, and configured to output a result of the addition.

13. The image sensor of claim 8, wherein the modulator is configured to delta-sigma modulate the input signal and output the delta-sigma modulated signal.

14. An image sensing system comprising:
   the image sensor of claim 8 configured to sense the light and generate the image signal based on the sensed light;
   a central processing unit (CPU) configured to control an operation of the image sensor; and
   a memory configured to store the image signal generated by the image sensor.

15. The image sensing system of claim 14, wherein the control signal is input to a first of the plurality of accumulators, and the first of the plurality of accumulators outputs the integration result in a first direction or a second direction according to the control signal.

16. The image sensing system of claim 15, wherein the first accumulator is a counter.

17. The image sensing system of claim 14, wherein the control signal is input to at least one of the plurality of accumulators other than a first of the plurality of accumulators connected to the modulator, and the at least one accumulator outputs the integration result in a first direction or a second direction according to the control signal.

18. The image sensing system claim 14, wherein the at least one of the plurality of accumulators is configured to add at least one sign bit to a most significant bit of the integration result that is output in a first direction or a second direction according to the control signal, and configured to output a result of the addition.

19. The image sensing system of claim 14, wherein the modulator is configured to delta-sigma modulate the input signal and output the delta-sigma modulated signal.

20. An analog-digital converter (ADC) comprising:
   a modulator configured to modulate an input signal and output a modulated signal; and
   a digital integrator including a plurality of accumulators serially connected to one another, the digital integrator being configured to generate an integration result by integrating the modulated signal; wherein
   at least one of the plurality of accumulators is configured to change a sign of the integration result according to a control signal.

21. The ADC of claim 1, wherein the at least one of the plurality of accumulators is a bi-directional accumulator including a switching unit configured to change the direction in which the integration result is output according to the control signal.

22. The ADC of claim 20, wherein the at least one of the plurality of accumulators is a bi-directional accumulator including a switching unit configured to change the sign of the integration result according to the control signal.

* * * * *